US012568721B2

(12) United States Patent
Wang et al.

(10) Patent No.: US 12,568,721 B2
(45) Date of Patent: Mar. 3, 2026

(54) LIGHT-EMITTING DIODE AND LIGHT-EMITTING DEVICE

(71) Applicant: Hubei Sanan Optoelectronics Co., Ltd., Hubei (CN)

(72) Inventors: Qing Wang, Hubei (CN); Zhanggen Xia, Hubei (CN); Minyou He, Hubei (CN); Guangyao Wu, Hubei (CN); Peng Liu, Hubei (CN); Lingyuan Hong, Hubei (CN); Chungying Chang, Hubei (CN)

(73) Assignee: Hubei Sanan Optoelectronics Co., Ltd., Hubei (CN)

( * ) Notice: Subject to any disclaimer, the term of this patent is extended or adjusted under 35 U.S.C. 154(b) by 431 days.

(21) Appl. No.: 18/340,890

(22) Filed: Jun. 26, 2023

(65) Prior Publication Data

US 2024/0014355 A1 Jan. 11, 2024

(30) Foreign Application Priority Data

Jul. 5, 2022 (CN) .......................... 202210790717.5

(51) Int. Cl.
H10H 20/841 (2025.01)
(52) U.S. Cl.
CPC ................................. H10H 20/841 (2025.01)
(58) Field of Classification Search
CPC .......................... H10H 20/841; H10H 20/857
See application file for complete search history.

(56) References Cited

U.S. PATENT DOCUMENTS

| | | | | |
|---|---|---|---|---|
| 7,800,122 B2 * | 9/2010 | Chiu | .................... | H10H 20/841 |
| | | | | 257/E33.068 |
| 8,963,178 B2 * | 2/2015 | Lee | ...................... | H10H 20/833 |
| | | | | 257/98 |
| 11,038,085 B2 * | 6/2021 | Chen | .................. | H01L 25/0753 |
| 2016/0013383 A1 * | 1/2016 | Wu | ...................... | H10H 20/814 |
| | | | | 257/98 |
| 2016/0349445 A1 * | 12/2016 | Kim | ...................... | G02B 6/0073 |
| 2016/0351759 A1 * | 12/2016 | Jung | .................. | H10H 20/8514 |
| 2020/0227581 A1 * | 7/2020 | Wu | .......................... | H10F 77/42 |
| 2021/0408338 A1 * | 12/2021 | Cho | ...................... | H10H 20/84 |

* cited by examiner

Primary Examiner — Steven B Gauthier
Assistant Examiner — Khatib A Rahman
(74) Attorney, Agent, or Firm — JCIPRNET

(57) ABSTRACT

A light-emitting diode includes a semiconductor light-emitting sequence layer and a DBR structure. The DBR structure is disposed on a first surface of the semiconductor light-emitting sequence layer. The DBR structure includes m first sublayers and n second sublayers stacked in an alternating manner, wherein m and n are positive integers larger than 1. Materials of the first sublayers and the second sublayers are different. One first sublayer and one second sublayer adjacent to each other are defined as a group of a stacked-layer structure. In each of at least 40% of the groups of the stacked-layer structures, an optical thickness of one sublayer is greater than ⅓ of a central wavelength of light emitted by the semiconductor light-emitting sequence layer and an optical thickness of the other sublayer is less than ⅓ of the central wavelength of the light emitted by the semiconductor light-emitting sequence layer.

20 Claims, 10 Drawing Sheets

20

202

201

201

201

201

202

LIGHT-EMITTING DIODE AND LIGHT-EMITTING DEVICE

CROSS-REFERENCE TO RELATED APPLICATION

This application claims the priority benefit of China application serial no. 202210790717.5, filed on Jul. 5, 2022. The entirety of the above-mentioned patent application is hereby incorporated by reference herein and made a part of this specification.

BACKGROUND

Technical Field

The disclosure relates to the technical field of semiconductor manufacturing, and in particular, relates to a light-emitting diode and a light emitting device.

Description of Related Art

At present, the output of mini LED direct display is increasing year by year. Further, mini LED direct displays are widely used in various fields such as monitoring and commanding, high-definition broadcasting, high-end cinemas, office display, conference interaction, and virtual reality. Mini RGB lamp beads (direct display) are receiving increasing attention from the market. Mini RGB lamp beads (the lamp beads include red LEDs, green LEDs, as well as blue LEDs) are directly used as display pixels to provide the basic unit of imaging to achieve image display. Mini RGB lamp beads exhibit the advantages of self-light-emitting, thinner, wider color gamut, higher contrast, higher reliability, and longer service life. Therefore, mini RGB lamp beads have become an area where major display technology manufacturers around the world are rushing to make a share.

The control design of the light-emitting angles of the mini RGB lamp beads is an important difficulty in its technical development route because the sizes of the light-emitting angles will directly determine the multiple optical performances of the light beads. Since one mini RGB lamp bead is composed of LED chiplets of three primary colors to form one pixel point, in a currently-available mini RGB chip, there is a problem that the light-emitting angle of the red light chiplet is much smaller than that of the blue light chiplet and the green light chiplet. This problem limits the further improvement of the optical performance of the mini RGB lamp beads, for example, the image resolution cannot be further improved.

FIG. 11 shows the thickness distributions of the film stacks in a conventional DBR (distributed Bragg reflector) structure. In this kind of conventional flip-chip LED chip, the light-emitting angle range of the chip that can be achieved by the DBR structure is 140 degrees, so problems such as excessively large light-emitting angles can be found, and optical performance is thus affected.

SUMMARY

The disclosure provides a light-emitting diode including a semiconductor light-emitting sequence layer and a DBR structure.

The semiconductor light-emitting sequence layer has a side surface, a first surface, and a second surface opposite to the first surface. The DBR structure is disposed on the first surface of the semiconductor light-emitting sequence layer, wherein the DBR structure includes m first sublayers and n second sublayers stacked in an alternating manner, and m and n are positive integers larger than 1. Materials of the first sublayers and the second sublayers are different. One first sublayer and one second sublayer adjacent to each other are defined as a group of a stacked-layer structure. In each of at least 40% of the groups of the stacked-layer structures, an optical thickness of one of the first sublayer and the second sublayer is greater than $\frac{1}{3}$ of a central wavelength of light emitted by the semiconductor light-emitting sequence layer and an optical thickness of the other one of the first sublayer and the second sublayer is less than $\frac{1}{3}$ of the central wavelength of the light emitted by the semiconductor light-emitting sequence layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
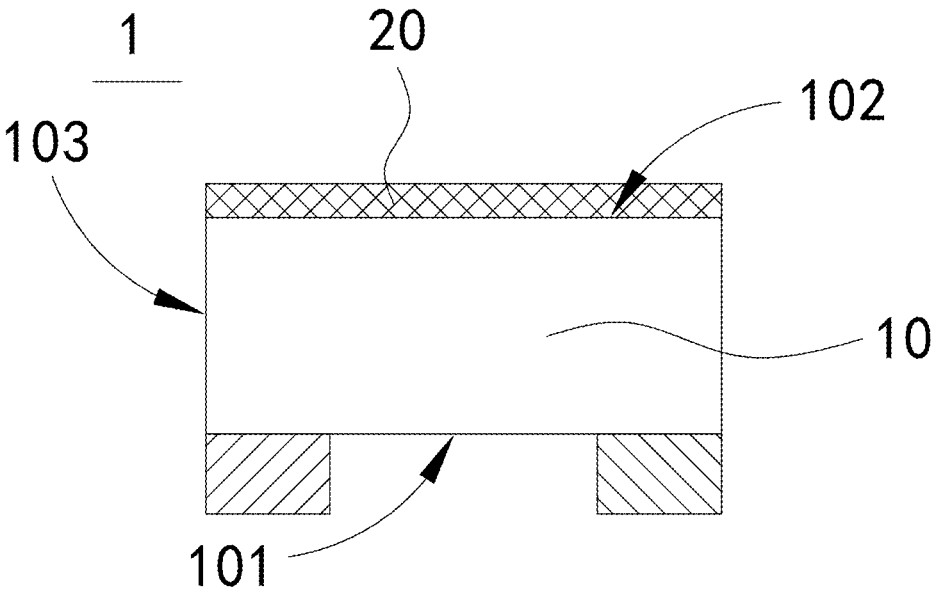
FIG. 1A is a schematic structural diagram of a light-emitting diode according to an embodiment of the disclosure.
Figure 1B:
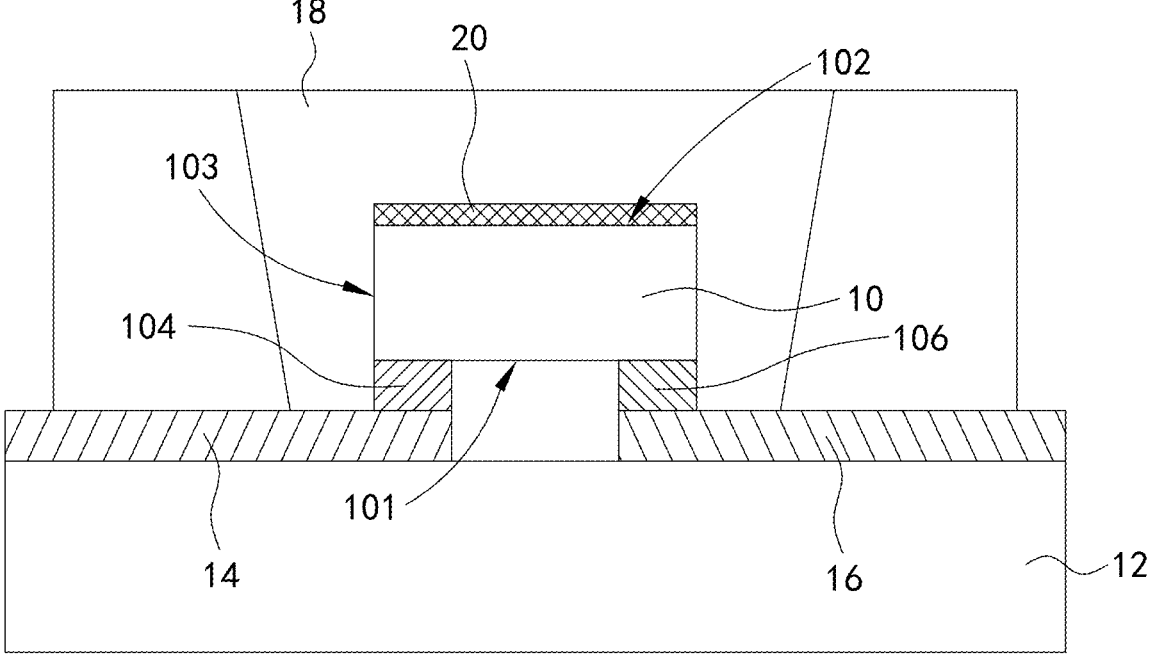
FIG. 1B is a schematic structural diagram of a packaging structure having the light-emitting diode of FIG. 1A according to an embodiment of the disclosure.
Figure 2:
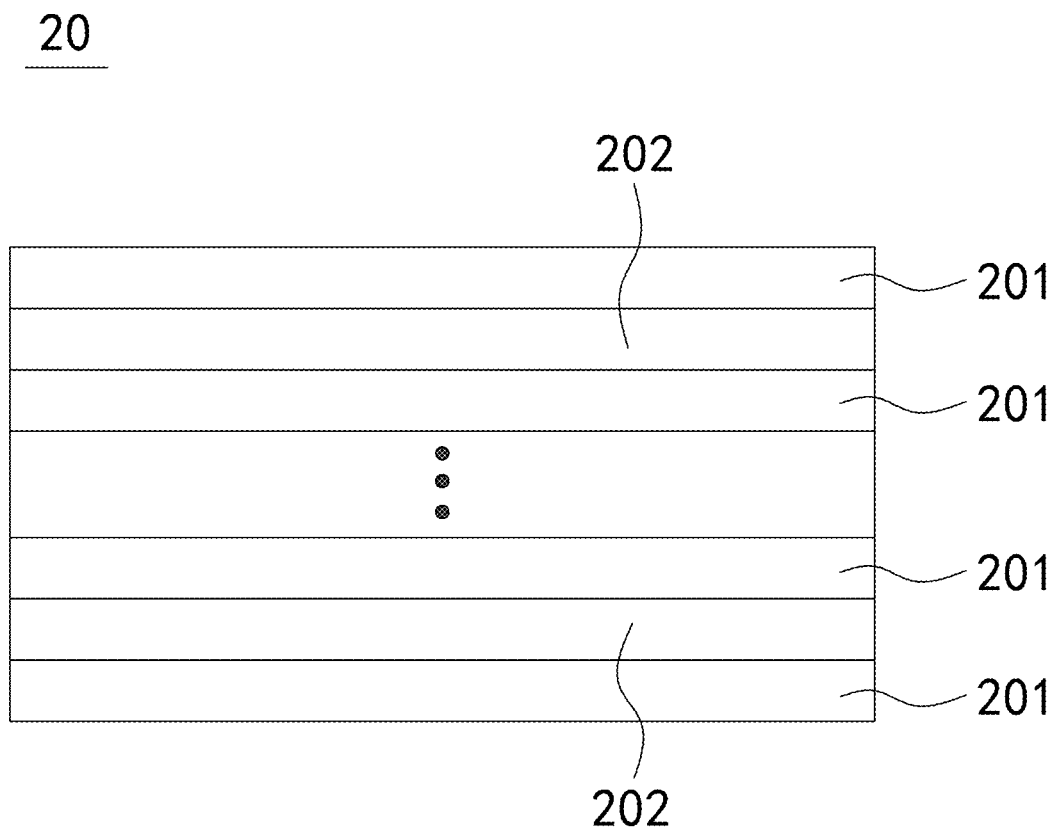
FIG. 2 is a schematic structural diagram of a DBR structure according to an embodiment of the disclosure.

With reference to FIG. 1A, FIG. 1B, and FIG. 2, FIG. 1A is a schematic structural diagram of a light-emitting diode 1 according to an embodiment of the disclosure, FIG. 1B is a schematic structural diagram of a packaging structure having the light-emitting diode 1 of FIG. 1A according to an embodiment of the disclosure, and FIG. 2 is a schematic structural diagram of a DBR structure 20 according to an embodiment of the disclosure. In order to achieve at least one of the advantages or other advantages, an embodiment of the disclosure provides a light-emitting diode 1. As shown in the figures, the light-emitting diode 1 may include a semiconductor light-emitting sequence layer 10 and a DBR structure 20. The light-emitting diode 1 may be a flip-chip light-emitting diode.

The semiconductor light-emitting sequence layer 10 has a first surface 102, a second surface 101, and a side surface 103, and the semiconductor light-emitting sequence layer 10 is configured to emit light with a central wavelength. In some embodiments, the semiconductor light-emitting sequence layer 10 includes an N-type semiconductor layer, a quantum well layer, and a P-type semiconductor layer, and the quantum well layer is located between the N-type semiconductor layer and the P-type semiconductor layer. Under the action of power supply, the N-type semiconductor layer provides electrons to the quantum well layer, the P-type semiconductor layer provides holes to the quantum well layer, and the electrons and holes combine in the quantum well layer to emit light. The quantum well layer may be a multiple quantum well structure, and the multiple quantum well structure includes multiple quantum well layers and multiple quantum barrier layers disposed in an alternating and repeated manner. For instance, the multiple quantum well structure may be, a multiple quantum well structure of AlGaInP/GaInP, GaN/AlGaN, InAlGaN/InAl-GaN, or InGaN/AlGaN. In addition, the composition and thickness of the well layers in the quantum well layer determine the wavelength of the generated light. By changing the depths of the quantum wells, the number of layers of the pairs of quantum wells and quantum barriers, the thicknesses, and/or other features in the quantum well layer, the light-emitting efficiency of the quantum well layer may be improved.

The DBR structure 20 is disposed on the first surface 102 of the semiconductor light-emitting sequence layer 10, and the DBR structure 20 is a periodic structure formed by two materials with different refractive indices disposed in an alternating ABAB manner. To be specific, the DBR structure 20 includes m first sublayers 201 and n second sublayers 202 stacked in an alternating manner, and m and n are both positive integers larger than 1. It should be noted that according to different actual situations, the sublayer closest to the semiconductor light-emitting sequence layer 10 in the DBR structure 20 may be the first sublayer 201 or the second sublayer 202. The materials of the first sublayer 201 and the second sublayer 202 are different, and the refractive indices of the first sublayer 201 and the second sublayer 202 are also different. In some embodiments, the DBR structure 20 may also cover the side surface 103 of the semiconductor light-emitting sequence layer 10.

Starting from the first surface 102 of the semiconductor light-emitting sequence layer 10, one first sublayer 201 and one second sublayer 202 adjacent to each other are defined as a group of a stacked-layer structure. In each of at least 40% of the groups of the stacked-layer structures, an optical thickness of the first sublayer 201 is greater than an optical thickness of the second sublayer 202.

Preferably, in each of at least 40% to 95% of the groups of the stacked-layer structures, the optical thickness of the first sublayer 201 is greater than the optical thickness of the second sublayer 202. For instance, if m=n=5, a total of 5 groups of stacked-layer structures are provided, so in each of at least 2 groups of the stacked-layer structures, the optical thickness of the first sublayer 201 is greater than the optical thickness of the second sublayer 202. With this design, light-emitting angles of a blue LED and a green LED may be decreased, so that light-emitting angles of mini RGB lamp beads become consistent, and optical performance, such as image resolution, of the mini RGB lamp beads is further improved.

It should be noted that when m is not equal to n, the number of groups of the stacked-layer structures is calculated from bottom to top with the first surface 102 as the base, and the last sublayer is not within the calculation range of the group number of the stacked-layer structures. For instance, if m=6 and n=5, the first sublayer 201 is closest to the first surface 102, a total of 5 groups of the stacked-layer structures are provided, and the last first sublayer 201 is not within the calculation range of the group number of the stacked-layer structures.

In some embodiments, a difference percentage between the optical thickness of each layer of at least 40% of the m first sublayers 201 and the optical thickness of the thickest first sublayer among the at least 40% of the m first sublayers is less than or equal to 20%. That is, among any at least 40% of the m first sublayers 201, when the thickest layer among the at least 40% of them first sublayers 201 is treated as a reference, in the at least 40% of them first sublayers 201, the difference percentage between the optical thickness of each first sublayer 201 and the optical thickness of the thickest first sublayer 201 is less than or equal to 20%.

For instance, a total of 5 first sublayers 201 are provided (m=5), and in at least 2 first sublayers 201, if the optical thickness of the thickest first sublayer 201 is 150 nm, there are at least 2 first sublayers 201 whose optical thicknesses differ from 150 nm by a percentage less than or equal to 20%. That is, the optical thicknesses of at least 2 first sublayers 201 ranges from 120 nm to 150 nm. In this way, the light-emitting angles of the blue LED and the green LED may be further decreased, so that the light-emitting angles of the mini RGB lamp beads become consistent, and the optical performance of the mini RGB lamp beads are improved.

In some embodiments, a percentage difference between the optical thickness of each layer of at least 40% of the n second sublayers and the optical thickness of the thickest second sublayer among the at least 40% of the n second sublayers is less than or equal to 20%. That is, among any at least 40% of the n second sublayers 202, when the thickest layer among the at least 40% of the n second sublayers 202 is treated as a reference, in the at least 40% of the n second sublayers 202, the difference percentage between the optical thickness of each second sublayer 202 and the optical thickness of the thickest second sublayer 202 is less than or equal to 20%. For instance, a total of 5 second sublayers 202 are provided (n=5), and in at least 2 second sublayers 202, if the optical thickness of the thickest second sublayer 202 is 150 nm, there are at least 2 second sublayers 202 whose optical thicknesses differ from 150 nm by a percentage less than or equal to 20%. That is, the optical thicknesses of at least 2 second sublayers 202 ranges from 120 nm to 150 nm. In this way, the light-emitting angles of the blue LED and the green LED may be further decreased, so that the light-emitting angles of the mini RGB lamp beads become consistent, and the optical performance of the mini RGB lamp beads are improved.

In some embodiments, in each of the at least 40% of the groups of the stacked-layer structures, the optical thickness of one sublayer (may be the first sublayer 201 or the second sublayer 202) is greater than ⅓ of the central wavelength of the light emitted by the semiconductor light-emitting sequence layer 10 and the optical thickness of the other sublayer is less than ⅓ of the central wavelength of the light emitted by the semiconductor light-emitting sequence layer 10. For instance, taking the central wavelength of light as 450 nm as an example, m=n=6, and there are 6 groups of the stacked-layer structure in total. Then in each of at least 3 groups of the stacked-layer structures, the optical thickness of the first sublayer 201 or the second sublayer 202 is greater than 150 nm, and the optical thickness of the other sublayer in the same stacked-layer structure is less than 150 nm. As such, the light-emitting angles of the blue LED and the green LED may be further decreased, so that the light-emitting angles of the mini RGB lamp beads become consistent, and the optical performance of the mini RGB lamp beads are improved. Preferably, when the semiconductor light-emitting sequence layer 10 emits blue light, in each of the at least 40% of the groups of the stacked-layer structures, the optical thickness of one sublayer is greater than 150 nm and the optical thickness of the other sublayer is less than 150 nm. Preferably, when the semiconductor light-emitting sequence layer 10 emits green light (the central wavelength is 520 nm), in each of the at least 40% of the groups of the stacked-layer structures, the optical thickness of one sublayer is greater than 174 nm and the optical thickness of the other sublayer is less than 174 nm.

In some embodiments, m>n, and the DBR structure has a first layer and a last layer opposite to the first layer, and the first layer and the last layer are both the first sublayers 201. Preferably, the material of the first sublayers 201 includes TiO$_2$. The first layer uses the high adhesion of TiO$_2$ to strengthen the connection between the DBR structure 20 and adjacent structures, such as strengthening the connection with the semiconductor light-emitting sequence layer 10 or strengthening the connection with the substrate. The last layer further reduces the light-emitting angles of the blue LED and the green LED by virtue of the high reflectivity of TiO$_2$, so that the light-emitting angles of the mini RGB lamp beads become consistent, and the optical performance of the mini RGB lamp beads are improved.

In some embodiments, the optical thicknesses of the first sublayers 201 range from 75.6 nm to 252 nm, and the optical thicknesses of the second sublayers 202 range from 87.5 nm to 438 nm. Preferably, when the semiconductor light-emitting sequence layer 10 emits blue light, the optical thicknesses of the first sublayers 201 range from 87.5 nm to 225 nm, and the optical thicknesses of the second sublayers 202 range from 87.5 nm to 225 nm.

Preferably, when the semiconductor light-emitting sequence layer 10 emits green light, the optical thicknesses of the first sublayers 201 range from 101.5 nm to 261 nm, and the optical thicknesses of the second sublayers 202 range from 101.5 nm to 261 nm.

In some embodiments, refractive indices of the first sublayers 201 range from 2.0 to 2.7, and refractive indices of the second sublayers 202 range from 1.35 to 1.7. The material of the first sublayers 201 may be TiO$_2$, Ni$_2$O$_5$, Ta$_2$O$_5$, HfO$_2$, the material of the second sublayers 202 may be SiO$_2$, MgF$_2$, Al$_2$O$_3$, or SiO$_x$N$_y$, where 2x+3y=4, and both x and y are greater than 0.

In some embodiments, a reflectivity of the DBR structure 20 to incident light of 0° to 30° emitted by the semiconductor light-emitting sequence layer 10 is lower than the reflectivity of the DBR structure 20 to incident light of 30° to 60° emitted by the semiconductor light emitting sequence layer 10.

In some embodiments, the reflectivity of the DBR structure 20 to the light of 0° to 30° emitted by the semiconductor light-emitting sequence layer 10 is lower than 50%, and the reflectivity of the DBR structure 20 to the incident light of 30° to 60° emitted by the semiconductor light emitting sequence layer 10 is greater than 50%.

In some embodiments, the reflectivity of the DBR structure 20 to light of 0° to 10° emitted by the semiconductor light-emitting sequence layer 10 is lower than 10%, or further, the reflectivity of the DBR structure 20 to light of 0° to 20° emitted by the semiconductor light emitting sequence layer 10 is lower than 10%.

In some embodiments, the reflectivity of the DBR structure 20 to light of 60° to 90° emitted by the semiconductor light-emitting sequence layer 10 is greater than 80%.

That is, the DBR structure 20 may transmit more light at small angles and reflect more light at large angles. In this way, the light-emitting angles of the blue LED and the green LED may be decreased, so that the light-emitting angles of the mini RGB lamp beads become consistent.

In some embodiments, in the at least 40% of the groups of the stacked-layer structures, for example, more than 40% of the groups, more than 60% of the groups, more than 70% of the groups, more than 80% of the groups, or more than 90% of the groups, differences between the optical thicknesses of the first sublayers 201 and the optical thicknesses of the second sublayers 202 range from 50 nm to 100 nm or from −50 nm to −100 nm. With the one-thick-one-thin design used in more than 40% of the adjacent sublayers, the mini RGB lamp beads are allowed to maintain high brightness intensity for small-angle light. In this way, the light-emitting angles are decreased, so that the light-emitting angles of the mini RGB lamp beads become consistent, and the optical performance of the mini RGB lamp beads are improved.

In some embodiments, in the at least 40% of the groups of the stacked-layer structures, the differences between optical thicknesses of the first sublayers 201 and optical thicknesses of the second sublayers 202 all range from 50 nm to 100 nm. In some embodiments, in the at least 40% of the groups of the stacked-layer structures, the differences between optical thicknesses of the first sublayers 201 and optical thicknesses of the second sublayers 202 all range from −50 nm to −100 nm.

In some embodiments, in some of the at least 40% of the groups of the stacked-layer structures, differences between the optical thicknesses of the first sublayers 201 and the optical thicknesses of the second sublayers 202 range from 50 nm to 100 nm, and in others of the at least 40% of the groups of the stacked-layer structures, the differences between the optical thicknesses of the first sublayers 201 and the optical thicknesses of the second sublayers 202 range from −50 nm to −100 nm.

In some embodiments, a side length of the light-emitting diode 1 is less than 200 μm, and m+n≤20. By controlling the thickness of the DBR structure 20 not to be excessively thick, dangerous situations such as chip warpage, easy cracking during cutting are prevented from occurring.

The light-emitting diode 1 may further include a substrate located between the first surface 102 of the semiconductor light-emitting sequence layer 10 and the DBR structure 20, and the substrate located on the side of the first surface 102 may be a transparent substrate, so that light may pass through and exit. The transparent substrate may be a sapphire substrate. Preferably, a thickness of the sapphire substrate ranges from 60 nm to 150 nm.

The side of the second surface 101 of the semiconductor light-emitting sequence layer may be further provided with an insulating layer, an anode bonding plate 104, and a cathode bonding plate 106. The anode bonding plate 104 and the cathode bonding plate 106 are electrically connected to the N-type semiconductor layer and the P-type semiconductor layer of the semiconductor light-emitting sequence layer 10, respectively.

The insulating layer may be a second DBR structure. The second DBR structure is a highly reflective DBR layer, which can achieve a high reflectivity of more than 80% for light with an incident angle ranging from 0° to 60°.

In some embodiments, the packaging structure including the light emitting diode 1 may further include a substrate 12, an anode bonding pad 14, and a cathode bonding pad 16. An anode and a cathode of the semiconductor light-emitting sequence layer 10 are respectively connected to the anode bonding plate 104 and the cathode bonding plate 106. The anode bonding plate 104 is connected to the anode bonding pad 14, the cathode bonding plate 106 is connected to the cathode bonding pad 16, and the anode bonding pad 14 and the cathode bonding pad 16 are disposed on the substrate 12. The packaging structure 18 covers the semiconductor light-emitting sequence layer 10 and the DBR structure 20.

Figure 3:
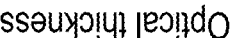
FIG. 3 is a schematic graph of optical thicknesses of the DBR structure according to an embodiment of the disclosure.
Figure 4:
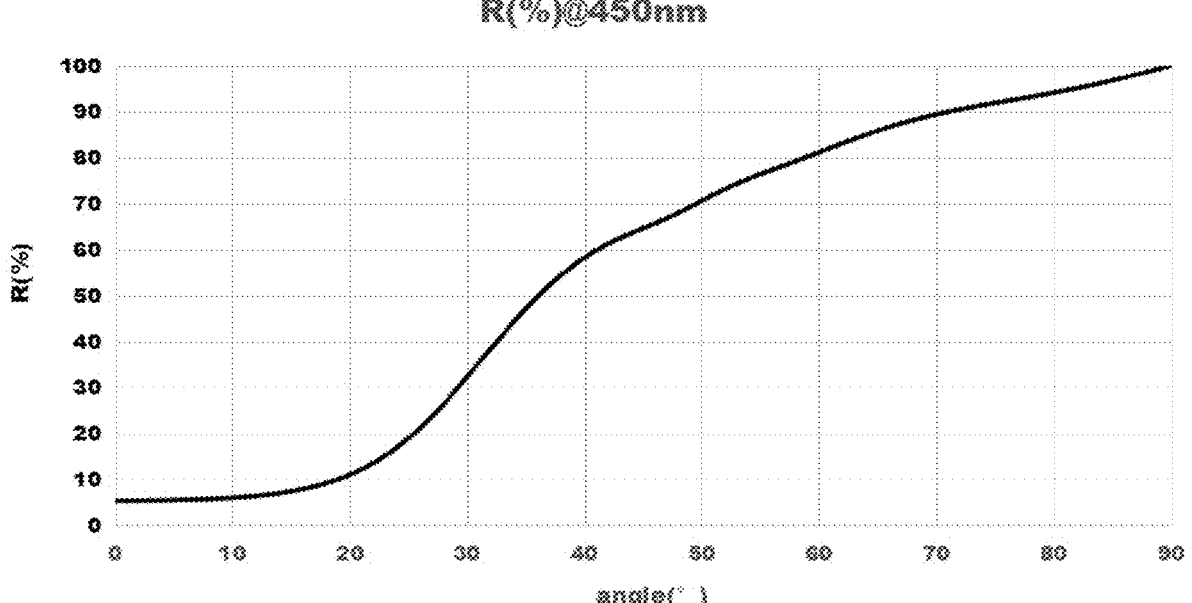
FIG. 4 is a schematic graph of reflection properties of the DBR structure of FIG. 3.

With reference to FIG. 3 and FIG. 4, in the DBR structure 20 shown in FIG. 3, the first sublayers 201 are TiO$_2$ layers, the second sublayers 202 are SiO$_2$ layers, m=8, n=7, the refractive index of the TiO$_2$ layers is 2.52, and the refractive index of SiO$_2$ is 1.46. The leftmost first layer is the sublayer closest to the first surface 102. There are 3 groups of the stacked-layer structures in which the optical thicknesses of the first sublayers 201 are greater than the optical thicknesses of the second sublayers 202. There are 4 TiO$_2$ layers whose optical thicknesses differs by a percentage less than or equal to 20% from the optical thickness of the thickest TiO$_2$ layer. There are 4 SiO$_2$ layers whose optical thicknesses differs by a percentage less than or equal to 20% from the optical thickness of the thickest SiO$_2$ layer. There are 3 groups of the stacked-layer structures in which the optical thicknesses of the SiO$_2$ layers are greater than 150 nm and the optical thicknesses of the TiO$_2$ layers are less than 150 nm. There are 2 groups of the stacked-layer structures in which the optical thicknesses of the TiO$_2$ layers are greater than 150 nm and the optical thicknesses of the SiO$_2$ layers are less than 150 nm. The share of stacked layers with the above rules is 71.4%. As shown in FIG. 4, the DBR structure 20 with this design exhibits high transmittance at small angles (10° to 30°) and high reflectivity at large angles for light (blue light) with a central wavelength of 450 nm. In this way, the light-emitting angles are decreased, and the light emitting angles of the mini RGB lamp beads become consistent. Compared to the conventional large light-emitting angle of 140 degrees, in the light-emitting diode 1 of this embodiment, the range of the light-emitting angle may be further narrowed to about 107 degrees, and the light intensity within this range is enhanced, so that optical performance is be improved.

Figure 5:
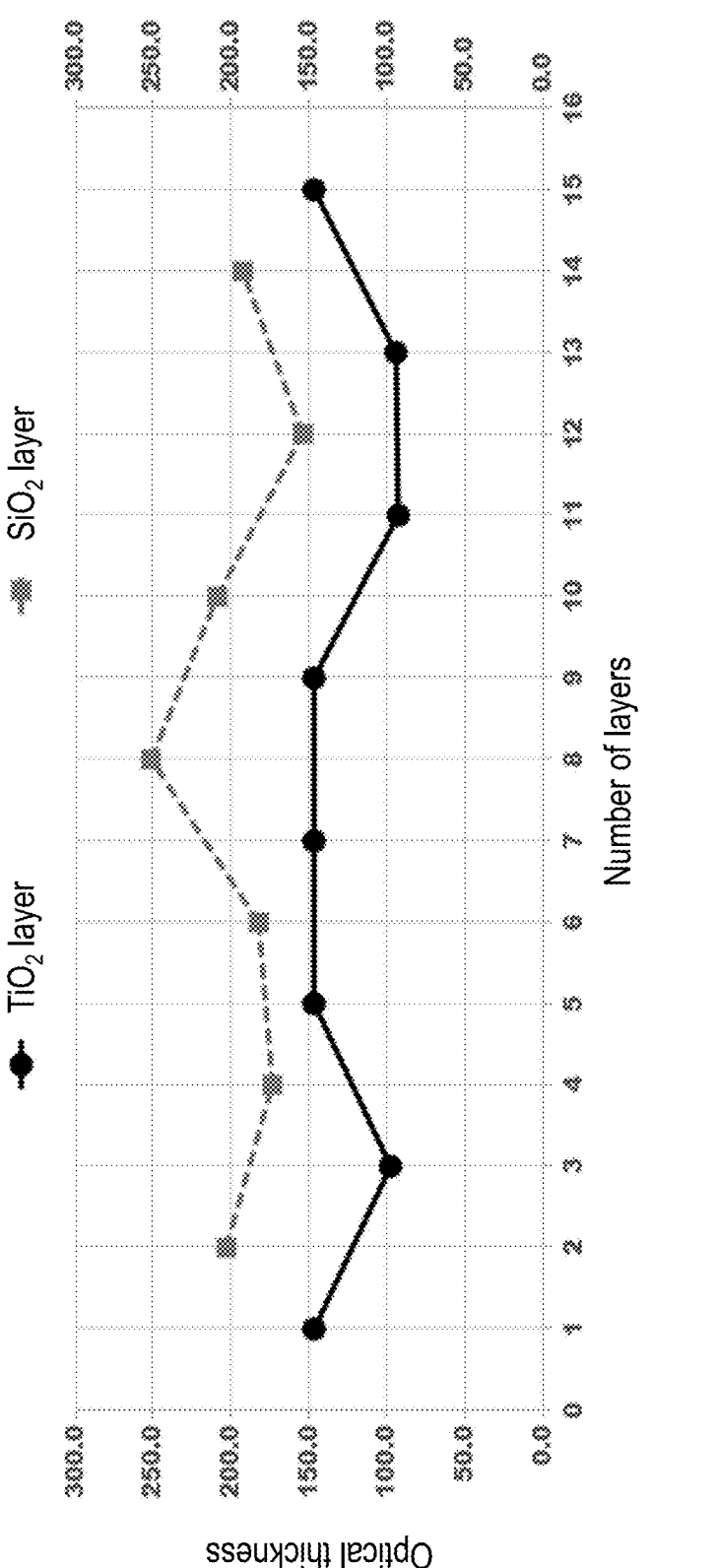
FIG. 5 is a schematic graph of optical thicknesses of the DBR structure according to another embodiment of the disclosure.
Figure 6:
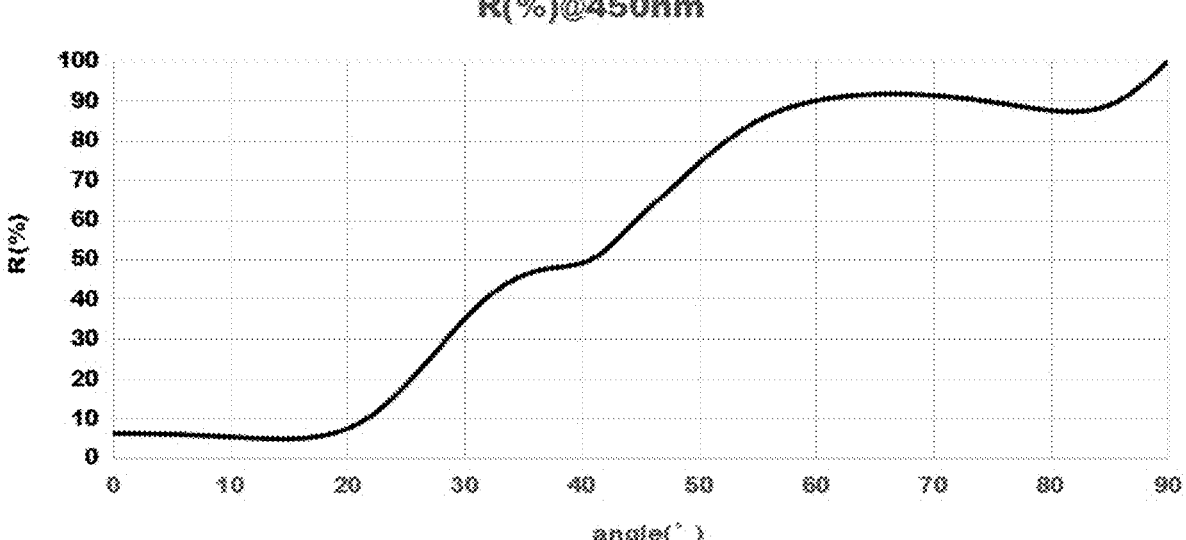
FIG. 6 is a schematic graph of reflection properties of the DBR structure of FIG. 5.

With reference to FIG. 5 and FIG. 6, in the DBR structure 20 shown in FIG. 5, the first sublayers 201 are SiO$_2$ layers, the second sublayers 202 are TiO$_2$ layers, m=7, n=8, the refractive index of the TiO$_2$ layers is 2.52, and the refractive index of SiO$_2$ is 1.46. The leftmost first layer is the sublayer closest to the first surface 102. In this embodiment, the optical thicknesses of the SiO$_2$ layers are all greater than the optical thicknesses of the TiO$_2$ layers, the optical thicknesses of the SiO$_2$ layers are greater than 150 nm, and the optical thicknesses of the TiO$_2$ layers are less than 150 nm. As shown in FIG. 6, the DBR structure 20 with this design exhibits high transmittance at small angles (10° to 30°) and high reflectivity at large angles for light (blue light) with a central wavelength of 450 nm. In this way, the light-emitting angles are decreased, and the light emitting angles of the mini RGB lamp beads become consistent.

Figure 7:
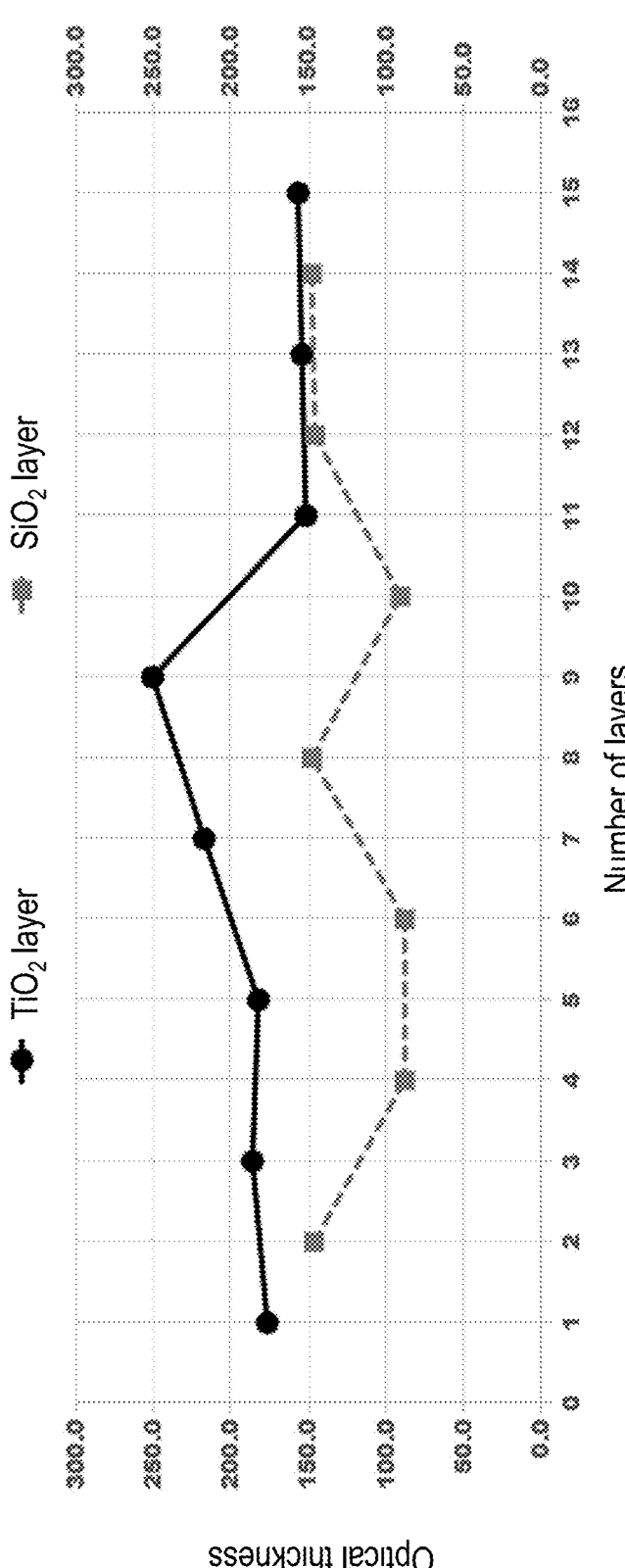
FIG. 7 is a schematic graph of optical thicknesses of the DBR structure according to still another embodiment of the disclosure.
Figure 8:
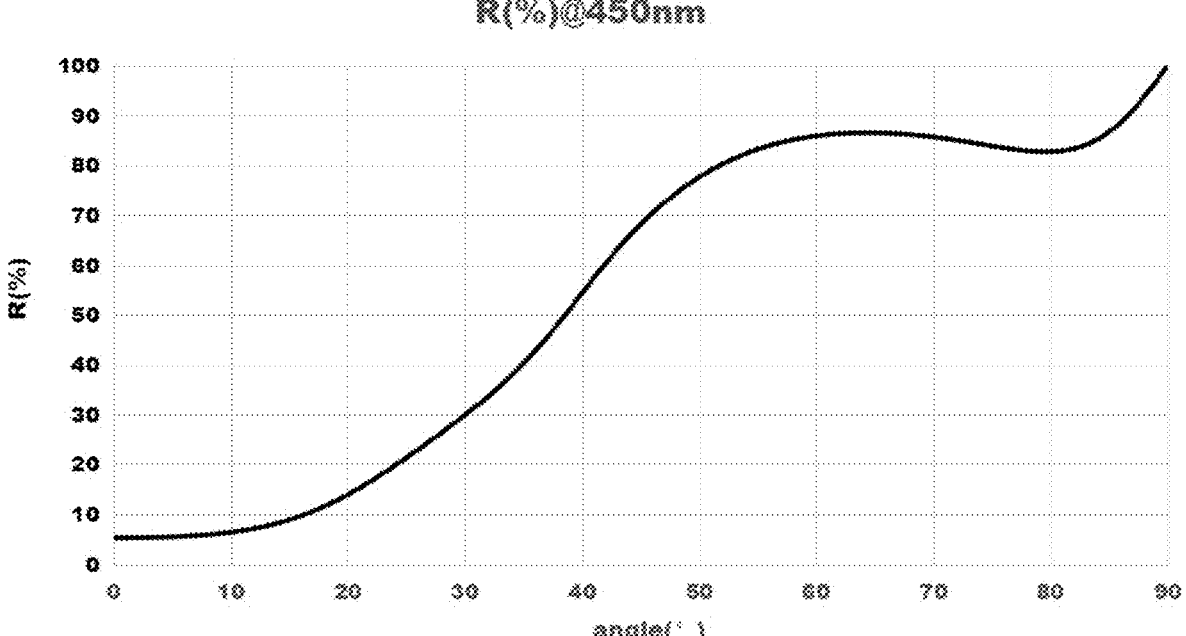
FIG. 8 is a schematic graph of reflection properties of the DBR structure of FIG. 7.

With reference to FIG. 7 and FIG. 8, in the DBR structure 20 shown in FIG. 7, the first sublayers 201 are TiO$_2$ layers, the second sublayers 202 are SiO$_2$ layers, m=8, and n=7. The leftmost first layer is the sublayer closest to the first surface 102. In this embodiment, the optical thicknesses of the TiO$_2$ layers are all greater than the optical thicknesses of the SiO$_2$ layers, the optical thicknesses of the TiO$_2$ layers are greater than 150 nm, and the optical thicknesses of the SiO$_2$ layers are less than 150 nm. As shown in FIG. 6, the DBR structure 20 with this design exhibits high transmittance at small angles (10° to 30°) and high reflectivity at large angles for light (blue light) with a central wavelength of 450 nm. In this way, the light-emitting angles are decreased, and the light emitting angles of the mini RGB lamp beads become consistent. It should be added that the abscissa in FIG. 4, FIG. 6, and FIG. 8 is the incident angle, and the ordinate is the reflectivity.

Figure 9:
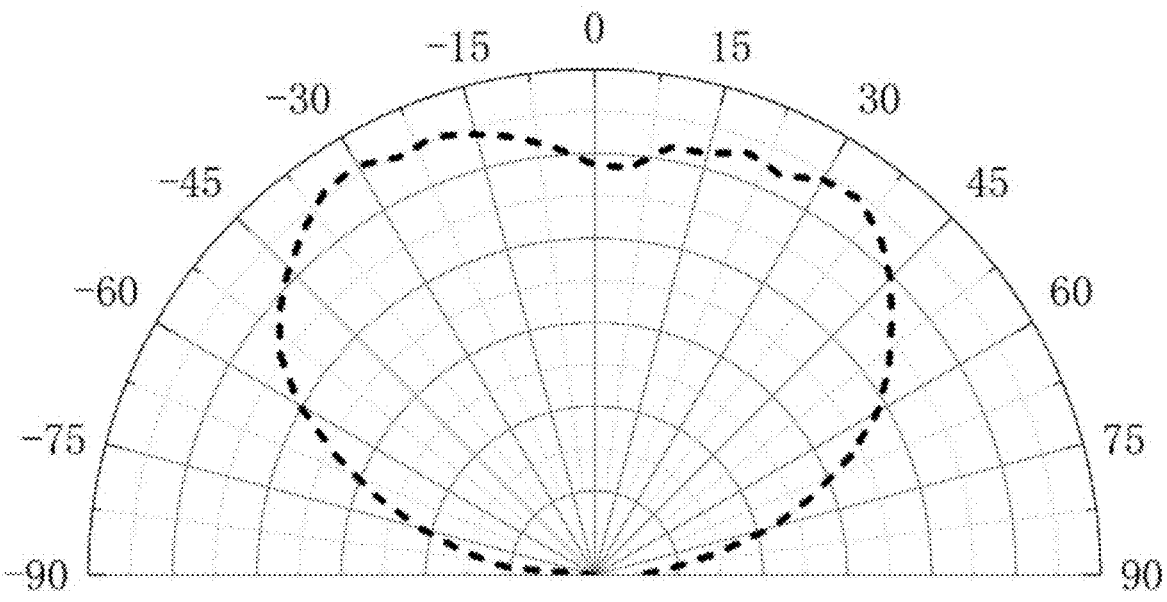
FIG. 9 is a schematic graph of a light distribution curve of currently-available mini RGB lamp beads.
Figure 10:
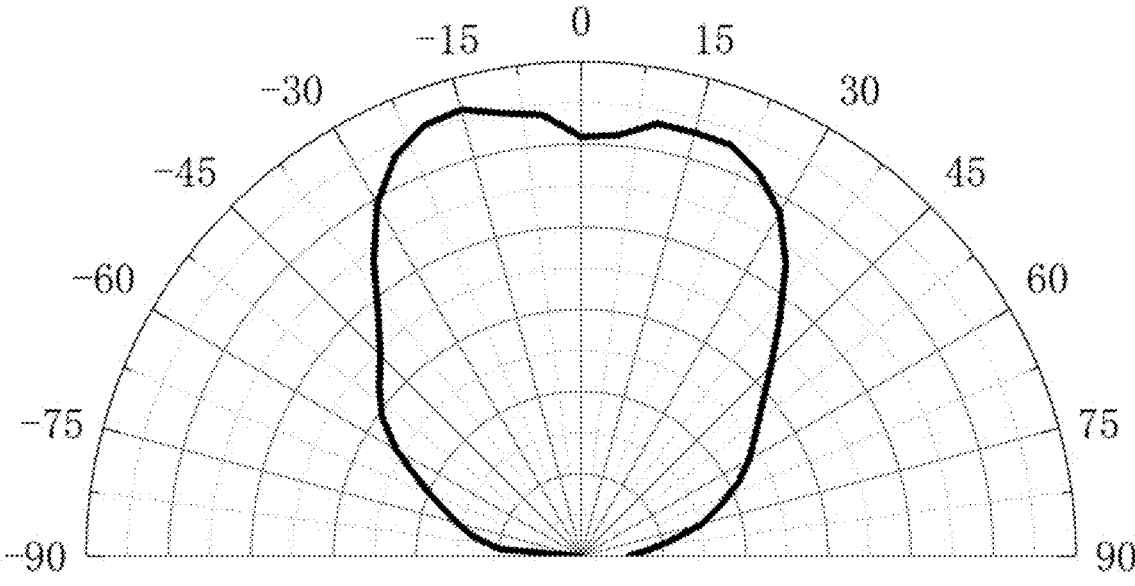
FIG. 10 is a schematic graph of a light distribution curve of mini RGB lamp beads using the light-emitting diode of this embodiment.
Figure 11:
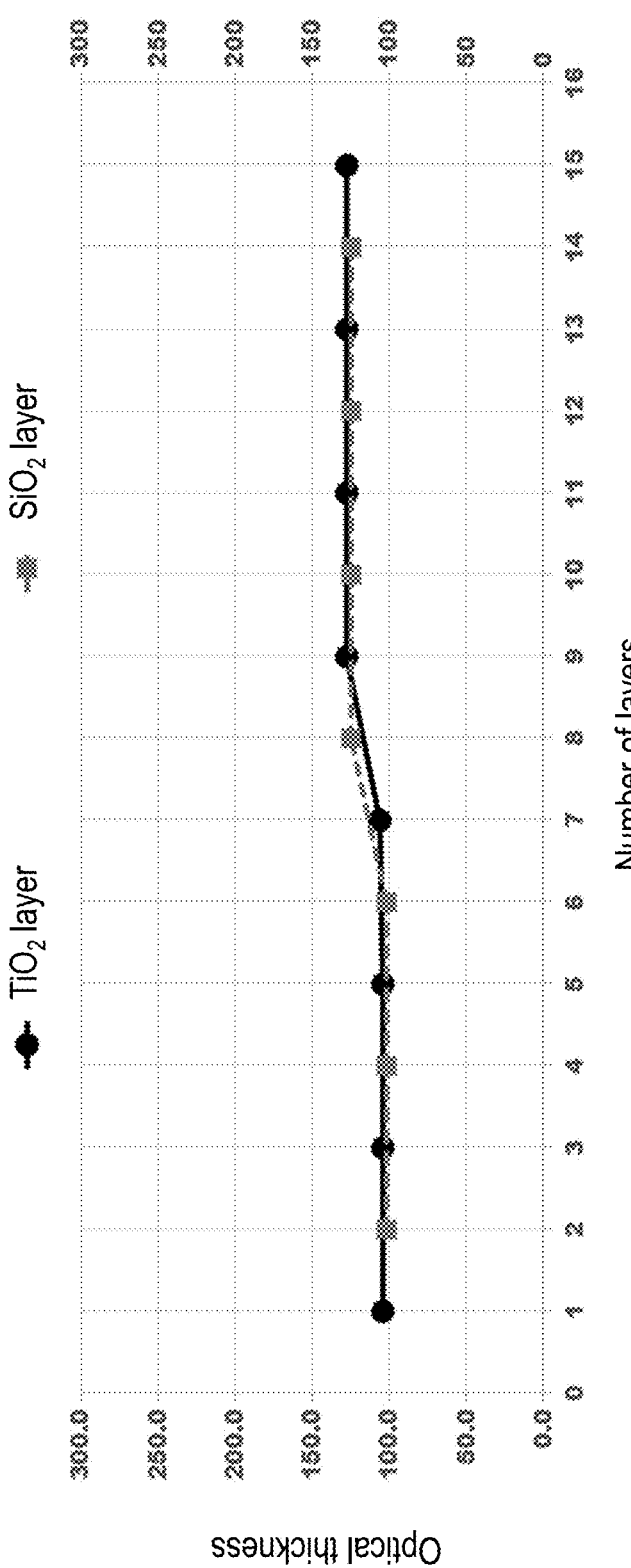
FIG. 11 is a schematic graph of optical thickness distributions of a conventional DBR structure.

With reference to FIG. 9 and FIG. 10, FIG. 9 is a schematic graph of a light distribution curve of currently-available mini RGB lamp beads, and FIG. 10 is a schematic graph of a light distribution curve of mini RGB lamp beads using the light-emitting diode 1 of this embodiment. By comparing FIG. 9 to FIG. 10, it can be seen that compared with the currently-available mini RGB lamp beads, for most of the light with high brightness intensity, in the light-emitting diode 1 provided by the disclosure, with the one-thick-one-thin design used in more than 40% of the adjacent sublayers, the mini RGB lamp beads are allowed to maintain high brightness intensity for small-angle light. In this way, the light-emitting angles are decreased, so that the light-emitting angles of the mini RGB lamp beads become consistent, and the optical performance of the mini RGB lamp beads are improved. It should be noted that the abscissa in FIG. 9 and FIG. 10 is the brightness intensity, which is represented by polar coordinates. The brightness intensity at −90 degrees and 90 degrees is 0.6, and the brightness intensity at the center point is 0.

An embodiment of the disclosure further provides a light-emitting device including the light emitting diode 1 according to any embodiment of the above.

In view of the foregoing, an embodiment of the disclosure provides the light-emitting diode 1 and the light-emitting device. Through the special design of the first sublayers 201 and the second sublayers 202, light-emitting angles of the blue LED and the green LED may be decreased, so that light-emitting angles of the mini RGB lamp beads become consistent, and optical performance, such as image resolution, of the mini RGB lamp beads is further improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting diode, comprising:

a semiconductor light-emitting sequence layer having a side surface, a first surface, and a second surface opposite to the first surface; and a DBR structure disposed on the first surface of the semiconductor light-emitting sequence layer, wherein the DBR structure comprises m first sublayers and n second sublayers stacked in an alternating manner, m and n are positive integers larger than 1, materials of the first sublayers and the second sublayers are different, one first sublayer and one second sublayer adjacent to each other are defined as a group of a stacked-layer structure, and in each of at least 40% of the groups of the stacked-layer structures, an optical thickness of one of the first sublayer and the second sublayer is greater than ⅓ of a central wavelength of light emitted by the semiconductor light-emitting sequence layer and an optical thickness of the other one of the first sublayer and the second sublayer is less than ⅓ of the central wavelength of the light emitted by the semiconductor light-emitting sequence layer.

2. The light-emitting diode according claim 1, wherein a difference percentage between an optical thickness of each layer of at least 40% of the m first sublayers and the optical thickness of the thickest first sublayer among the at least 40% of the m first sublayers is less than or equal to 20%.

3. The light-emitting diode according claim 1, wherein a percentage difference between an optical thickness of each layer of at least 40% of the n second sublayers and the optical thickness of the thickest second sublayer among the at least 40% of the n second sublayers is less than or equal to 20%.

4. The light-emitting diode according claim 1, wherein in each of the at least 40% of the groups of the stacked-layer structures, an optical thickness of the first sublayer is greater than an optical thickness of the second sublayer.

5. The light-emitting diode according claim 1, wherein the semiconductor light-emitting sequence layer emits blue light, and in each of the at least 40% of the groups of the stacked-layer structures, the optical thickness of one of the first sublayer and the second sublayer is greater than 150 nm and the optical thickness of the other one of the first sublayer and the second sublayer is less than 150 nm.

6. The light-emitting diode according claim 1, wherein the semiconductor light-emitting sequence layer emits green light, and in each of the at least 40% of the groups of the stacked-layer structures, the optical thickness of one of the first sublayer and the second sublayer is greater than 174 nm and the optical thickness of the other one of the first sublayer and the second sublayer is less than 174 nm.

7. The light-emitting diode according claim 1, wherein m>n, the DBR structure has a first layer and a last layer opposite to the first layer, the first layer is the first sublayer, and the last layer is the first sublayer.

8. The light-emitting diode according claim 7, wherein the material of the first sublayers comprises $TiO_2$.

9. The light-emitting diode according claim 1, wherein the semiconductor light-emitting sequence layer emits blue light, optical thicknesses of the first sublayers range from 87.5 nm to 225 nm, and optical thicknesses of the second sublayers range from 87.5 nm to 225 nm.

10. The light-emitting diode according claim 1, wherein the semiconductor light-emitting sequence layer emits green light, optical thicknesses of the first sublayers range from 101.5 nm to 261 nm, and optical thicknesses of the second sublayers range from 101.5 nm to 261 nm.

11. The light-emitting diode according claim 1, wherein refractive indices of the first sublayers range from 2.0 to 2.7, and refractive indices of the second sublayers range from 1.35 to 1.7.

12. The light-emitting diode according claim 1, wherein a reflectivity of the DBR structure to incident light of 0° to 30° emitted by the semiconductor light-emitting sequence layer is lower than the reflectivity of the DBR structure to incident light of 30° to 60° emitted by the semiconductor light emitting sequence layer.

13. The light-emitting diode according claim 1, wherein an anode bonding plate and a cathode bonding plate are disposed on a second surface side of the semiconductor light-emitting sequence layer.

14. The light-emitting diode according claim 1, wherein a transparent substrate is disposed between a first surface side of the semiconductor light-emitting sequence layer and the DBR structure.

15. The light-emitting diode according claim 1, wherein the light-emitting diode is a flip-chip light-emitting diode.

16. The light-emitting diode according claim 1, wherein in the at least 40% of the groups of the stacked-layer structures, differences between optical thicknesses of the first sublayers and optical thicknesses of the second sublayers range from 50 nm to 100 nm or from −50 nm to −100 nm.

17. The light-emitting diode according claim 1, wherein in the at least 40% of the groups of the stacked-layer structures, differences between optical thicknesses of the first sublayers and optical thicknesses of the second sublayers all range from 50 nm to 100 nm, or in the at least 40% of the groups of the stacked-layer structures, the differences between the optical thicknesses of the first sublayers and the optical thicknesses of the second sublayers all range from −50 nm to −100 nm.

18. The light-emitting diode according claim 1, wherein in some of the at least 40% of the groups of the stacked-layer structures, differences between optical thicknesses of the first sublayers and optical thicknesses of the second sublayers range from 50 nm to 100 nm, and in others of the at least 40% of the groups of the stacked-layer structures, the differences between the optical thicknesses of the first sublayers and the optical thicknesses of the second sublayers range from −50 nm to −100 nm.

19. The light-emitting diode according claim 1, wherein a side length of the light-emitting diode is less than 200 μm, and m+n≤20.

20. A light-emitting device using the light-emitting diode according to claim 1.

* * * * *